(12) United States Patent
Markvicka et al.

(10) Patent No.: US 11,729,904 B2
(45) Date of Patent: Aug. 15, 2023

(54) METHOD OF PRODUCING UNTETHERED, STRETCHABLE, AND WEARABLE ELECTRONIC DEVICES

(71) Applicant: CARNEGIE MELLON UNIVERSITY, Pittsburgh, PA (US)

(72) Inventors: Eric J. Markvicka, Pittsburgh, PA (US); Michael D. Bartlett, Ames, IA (US); Carmel Majidi, Pittsburgh, PA (US); Lining Yao, Pittsburgh, PA (US); Guanyun Wang, Pittsburgh, PA (US); Yi-Chin Lee, Pittsburgh, PA (US); Gierad Laput, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 405 days.

(21) Appl. No.: 16/866,153

(22) Filed: May 4, 2020

(65) Prior Publication Data
US 2020/0413533 A1 Dec. 31, 2020

Related U.S. Application Data

(63) Continuation-in-part of application No. 16/129,717, filed on Sep. 12, 2018, now Pat. No. 10,645,803.
(Continued)

(51) Int. Cl.
*H05K 1/02* (2006.01)
*H05K 1/03* (2006.01)
(Continued)

(52) U.S. Cl.
CPC ........... *H05K 1/0283* (2013.01); *H05K 1/038* (2013.01); *H05K 1/0393* (2013.01);
(Continued)

(58) Field of Classification Search
CPC ........ G06F 1/163; G06F 1/1658; G06F 3/017; H05K 1/0283; H05K 1/038; H05K 1/0393;
(Continued)

(56) References Cited

U.S. PATENT DOCUMENTS

| 10,645,803 B2 * | 5/2020 | Majidi ................. H05K 3/0032 |
| 2015/0099062 A1 * | 4/2015 | Tseng ................. H01M 4/8875 |
| | | 427/115 |

(Continued)

OTHER PUBLICATIONS

An, B. et al. 2014. An end-to-end approach to making self-folded 3D surface shapes by uniform heating. IEEE International Conference on Robotics and Automation (ICRA), (May 2014). 1466-1473.
(Continued)

*Primary Examiner* — Minh N Trinh
(74) *Attorney, Agent, or Firm* — Michael G. Monyok

(57) ABSTRACT

An efficient fabrication technique, including an optional design step, is used to create highly customizable wearable electronics. The method of fabrication utilizes rapid laser machining and adhesion-controlled soft materials. The method produces well-aligned, multi-layered materials created from 2D and 3D elements that stretch and bend while seamlessly integrating with rigid components such as microchip integrated circuits (IC), discrete electrical components, and interconnects. The design step can be used to create a 3D device that conforms to different-shaped body parts. These techniques are applied using commercially available materials. These methods enable custom wearable electronics while offering versatility in design and functionality for a variety of bio-monitoring applications.

13 Claims, 12 Drawing Sheets

Related U.S. Application Data

(60) Provisional application No. 63/017,785, filed on Apr. 30, 2020, provisional application No. 62/606,182, filed on Sep. 12, 2017.

(51) Int. Cl.
*H05K 3/20* (2006.01)
*H05K 3/00* (2006.01)

(52) U.S. Cl.
CPC ............. *H05K 3/0026* (2013.01); *H05K 3/20* (2013.01); *H05K 2203/167* (2013.01)

(58) Field of Classification Search
CPC ......... H05K 1/189; H05K 2201/10151; H05K 2203/167; H05K 3/0026; H05K 3/20
See application file for complete search history.

(56) References Cited

U.S. PATENT DOCUMENTS

| 2016/0025669 | A1* | 1/2016 | Sun | ...................... | G01N 27/305 |
| | | | | | 204/418 |
| 2020/0413533 | A1* | 12/2020 | Majidi | .................. | G06F 1/1658 |

OTHER PUBLICATIONS

An, B. et al. 2018. Thermorph: Democratizing 4D Printing of Self-Folding Materials and Interfaces. In Proceedings of the 2018 CHI Conference on Human Factors in Computing Systems. (Apr. 2018), 260.
Bartlett, M.D. et al. 2016. Rapid Fabrication of Soft, Multilayered Electronics for Wearable Biomonitoring. Advanced Functional Materials. 26, 46 (2016), 8496-8504.
Brosteaux, D. et al. 2007. Design and fabrication of elastic interconnections for stretchable electronic circuits. IEEE Electron Device Letters, 28(7), (2007). 552-554.
Groeger, D. et al. 2018. ObjectSkin: Augmenting Everyday Objects with Hydroprinted Touch Sensors and Displays. Proceedings of the ACM on Interactive, Mobile, Wearable and Ubiquitous Technologies 1, 4 (Jan. 2018), 1-23.
Kao, H.-L. et al. 2016. DuoSkin: rapidly prototyping on-skin user interfaces using skin-friendly materials. Proceedings of the 2016 ACM International Symposium on Wearable Computers—ISWC '16 (New York, New York, USA, 2016), 16-23.
Lo, J. et al. 2016. Skintillates: Designing and Creating Epidermal Interactions. Proceedings of the 2016 ACM Conference on Designing Interactive Systems—DIS '16 (New York, New York, USA, 2016), 853-864.
Lu, T. et al. 2017. Soft-Matter Printed Circuit Board with UV Laser Micropatterning. ACS applied materials & interfaces, 9(26), (2017), 22055-22062.
Niiyama, R. et al. 2015. Sticky Actuator: Free-Form Planar Actuators for Animated Objects. Proceedings of the Ninth International Conference on Tangible, Embedded, and Embodied Interaction—TEI '14 (New York, New York, USA, 2015), 77-84.
Nittala, A.S. et al. 2018. Multi-Touch Skin. Proceedings of the 2018 CHI Conference on Human Factors in Computing Systems—CHI '18 (2018).
Weigel, M. et al. 2015. iSkin: Flexible, Stretchable and Visually Customizable On-Body Touch Sensors for Mobile Computing. Proceedings of the 33rd Annual ACM Conference on Human Factors in Computing Systems—CHI '15 (New York, New York, USA, 2015), 2991-3000.
Neigel, M. et al. 2017. Skinmarks: Enabling interactions on body landmarks using conformal skin electronics. In Proceedings of the 2017 CHI Conference on Human Factors in Computing Systems. (May 2017). 3095-3105.
Wessely, M. et al. 2016. Stretchis: Fabricating Highly Stretchable User Interfaces. Proceedings of the 29th Annual Symposium on User Interface Software and Technology—UIST '16 (New York, New York, USA, 2016), 697-704.
Yoon, S.H. et al. 2017. iSoft. Interactions. 25, 1 (Dec. 2017), 14-15.

* cited by examiner

METHOD OF PRODUCING UNTETHERED, STRETCHABLE, AND WEARABLE ELECTRONIC DEVICES

CROSS-REFERENCE TO RELATED APPLICATIONS

This application is a continuation-in-part of and claims the benefit under 35 U.S.C. § 120 of U.S. application Ser. No. 16/129,717, filed on Sep. 12, 2018, which claims the benefit under 35 U.S.C. § 119 of Provisional Application Ser. No. 62/606,182, filed Sep. 12, 2017, each of which is incorporated herein by reference.

STATEMENT REGARDING FEDERALLY SPONSORED RESEARCH

This invention was made with government support under NASA No. NNX14AO49G. The government has certain rights in this invention.

BACKGROUND OF THE INVENTION

Wearables have emerged as a promising interactive platform, imbuing the human body with always available computational capabilities. Progress in the performance, multifunctionality, and accessibility of soft electronic materials has allowed for wearable devices with reduced dependency on rigid or inextensible printed circuit boards. These advances have led to the emergence of deformable circuits and sensors that avoid mechanical incompatibility with skin by matching the elastic properties of soft biological tissue. Applications include fitness, fashion, wearable monitoring of physiological signals, electronic skin for data entry, and skin-mounted sensors for joint proprioception and motion capture. The ability for these electronics to bend, twist, and stretch is accomplished by using soft elastomers as a carrier medium for deterministically-patterned metal wiring or other conductive material.

While promising, efforts to incorporate these materials into fully-integrated wearable devices are currently limited by the lack of robust and size-scalable rapid prototyping techniques. Current fabrication methods typically require customized equipment or clean-room fabrication, can be labor-intensive, and take hours to days to create fully functional devices. Such constraints can limit personalized configurations and slow down design iterations, which can be particularly limiting in creating devices for multiple users. These various drawbacks make it difficult to accelerate development and can be potential barriers for scalability and commercialization, especially in the emerging area of personalized health monitoring. Further, current approaches create devices that often have low functionality as compared to their rigid counterparts as they typically only focus on a single component of the overall system (e.g., sensing or actuation), have limited stretchability, do not conform to complex body shapes, require tethered connections, or are ultimately limited by cumbersome and impractical equipment that hinders overall mobility.

Robust integration of soft materials into wearable computing and bio-monitoring systems requires a comprehensive fabrication approach that allows for a broad range of electronic materials, substrates, circuit architectures, and surface-mounted technologies. The comprehensive approach can include holistic fabrication techniques that combine a network of electronic components for sensing, signal processing, wireless communication, and power infrastructure. This also includes reliable methods for patterning, precision alignment, bonding, encapsulation, and electrical interfacing. The latter is particularly essential for local computation and communication, energy-efficient wireless networks, and connectivity with external hardware for power or signal processing. Some fabrication methods, like 3D printing, are limited in the mechanical and electrical performance of their build materials and do not support automated integration of IC components, which are necessary for fast, energy efficient, and miniaturized signal processing and communication. This is especially limiting for applications in wearable physiological sensing and bio-monitoring that rely on packaged microchips for biosignal acquisition and processing. Therefore, a key challenge in wearable bio-monitoring remains the complete and sequential integration of soft sensors, stretchable electrical interconnects, and miniaturized hardware for communication, power, and signal processing through scalable techniques for patterning, encapsulation, bonding, and attachment to soft carrier films or substrates suitable for use on various shaped body parts.

BRIEF SUMMARY

Described herein are robust fully functional, skin-mountable electronic devices and methods for producing the same. The devices may include untethered on-skin electronic devices that are small, flexible, and stretchable enough to resemble electronic bandages. In one embodiment, the device can be assembled on a spandex fabric substrate, which is attached to the human body using medical grade adhesive. These devices are fabricated using rapid prototyping and assembly techniques that integrate multiple soft material layers, for example soft non-tacky elastomers, and rigid elements in a single process. In one example embodiment, the fabrication method comprises using a readily available $CO_2$ laser outfitted with a simple alignment system to allow for the precise assembly of sensors through deterministic, adhesion-controlled soft transfer printing techniques. Assembly of the patterned material is controlled by modifying either the adhesion energy of a soft substrate or by adjusting the laser processing conditions. In some embodiments, the sensors do not require curing, surface modification, or additional chemical reactions and are bonded together through the inherent adhesion of the soft layers. This enables rapid fabrication that is not dependent on cure kinetics. In other embodiments, the fabrication technique is extended to a UV laser system, which expands the choice of allowable materials (including thin metal film) and enables the rapid fabrication of custom stretchable electronics through deterministic architectures. Further, the fabrication technique helps prevent delamination by accounting for non-planar body parts through the use of a flattening algorithm for conformal mapping of a 2D patch into a double-curvature, better accommodating to body surfaces.

DETAILED DESCRIPTION

Figure 1:
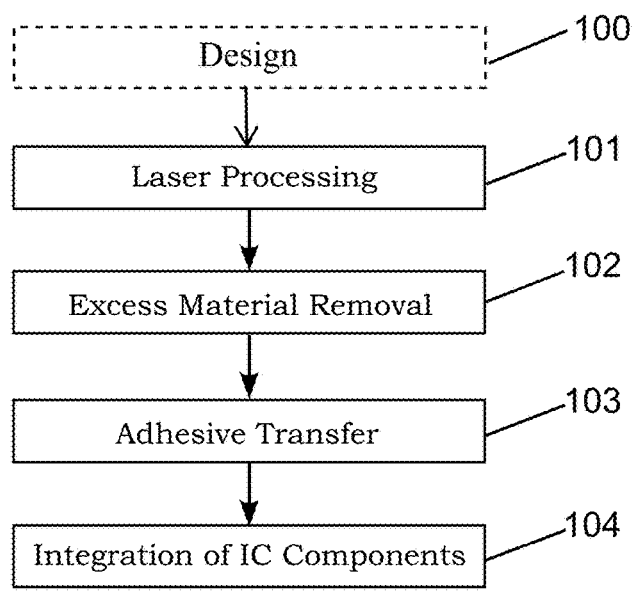
FIG. 1 is a flowchart of the method of the present invention, according to one embodiment.

In one embodiment, the rapid fabrication of soft functional materials of the present invention uses a combination of laser cutting with alignment control to create layers of a multilayered device and assembly of the layers through the deployment of a soft transfer printing technique. Referring to the flowchart depicted in FIG. 1, the method of fabrication comprises laser processing (step 101), removal of excess material (step 102), adhesive transfer (step 103), and integration of integrated circuit (IC) components (step 104). In an alternative embodiment, an optional design step (step 100) is performed for certain devices, such as those intended to be used on non-planar body parts.

Figure 2:
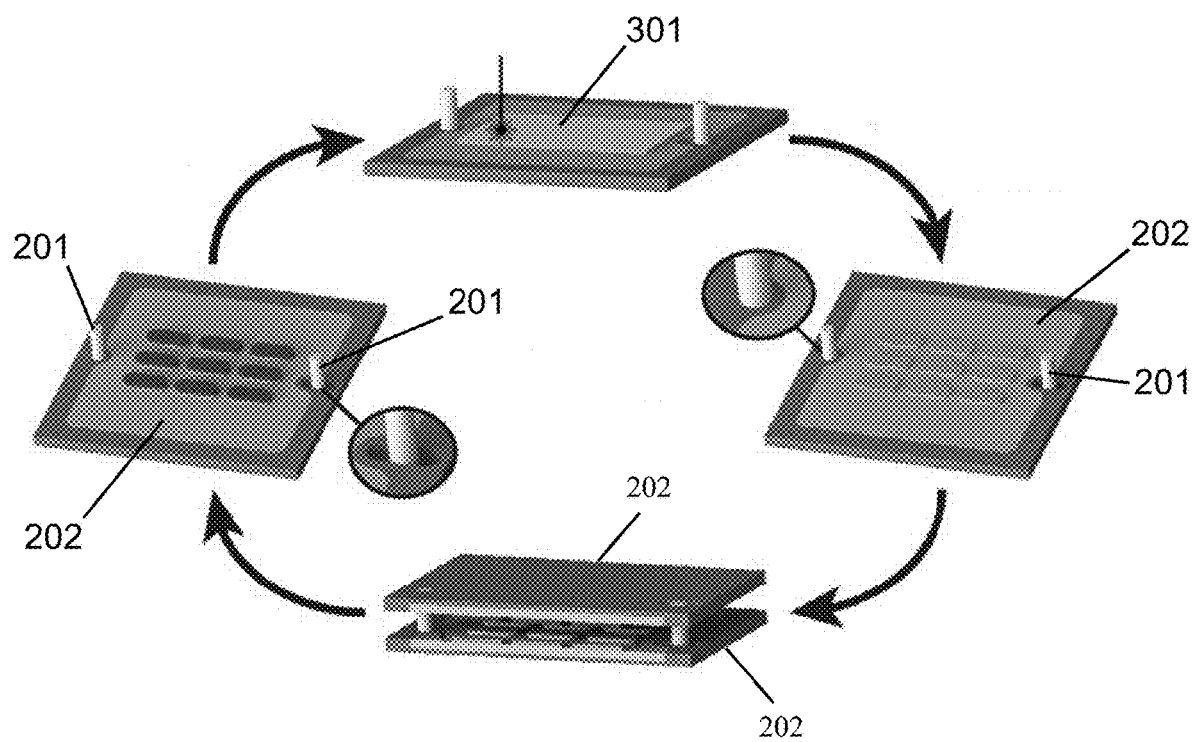
FIG. 2 is a diagram depicting the fabrication process of a multilayer device.

As shown in FIG. 2, laser processing in step 101 involves cutting and patterning a material 301 that will form a layer of the multilayer device 300. A single layer can be laminated to a substrate 202 and patterned, or multiple layers can be laminated and patterned during a single cutting operation. In one embodiment, the materials have the following characteristics: i) low effective elastic modulus, ii) high extensibility, iii) processable by laser cutting, and iv) bonding compatibility. However, other characteristics of the material may vary depending on the device 300 being fabricated. For example, in one embodiment, materials satisfying these criteria can include off-the shelf materials such as insulating or dielectric (VHB 4905, 3M) and conducting (eCAP 7805, 3M) acrylic tapes. These materials are soft, highly extensible, and, due to their inherent bonding characteristics, provide robust adhesion upon lamination under light pressure without additional treatment. Additionally, these materials are readily available in roll form and thus offer the advantage of being easily accessible, available in large quantities, and amenable to scalable production.

Referring again to FIG. 2, a soft substrate 202, or stamp, is used to support the material 301 during processing. The substrate 202 may further comprise a supporting backing, such as a metal plate, with a machined hole and a slot used as part of a locating mechanism 201. With the locating mechanism 201, the substrate 202 can be precisely positioned during each step of the fabrication process. The substrate 202 serves as a base for cutting and assembling layers of the multilayer device 300. The soft substrates can be non-tacky elastomers, such as silicone or soft polyurethanes, such as polydimethylsiloxane (PDMS).

After laser cutting, excess material is removed from the substrate 202 at step 102. At this stage, the material remaining on the substrate 202 is material that will form a layer in the multilayer device 300. Steps 101 and 102 can be repeated on separate substrates 202 to create additional layers that can be joined to form the device. Once the patterning for all layers is complete, at step 103 the individual layers are assembled through the deterministic soft material transfer printing process. During this step, the patterned layer or layers on a first substrate 202 is brought into contact with the patterned layer laminated to a second substrate 202. When the substrates 202 are separated, the layers of material 301 will remain in contact, with one layer being delaminated from its substrate 202. The force of adhesion between the combined layers is stronger than the force of adhesion between the delaminated layer and its substrate, resulting in the transfer of the layer from its substrate. Additional layers can be added to the first combined layers using the same process. After layers are transferred, at step 104 IC components are integrated, if necessary for the device 300. Depending on the intended use, the layers and IC components can be encapsulated to protect the device 300, such as through the use of a top layer.

Referring again to FIG. 2, the locating mechanism 201 comprises a hole machined into the backing of the substrate 202 and a complimentary pin disposed on the fixture 203, assembly table, or other structure used during fabrication. While a hole and pin are disclosed in this example embodiment, other mechanical interfaces such as slot, peg, recess, or similar structures can be used to align and position the substrate 202. The locating mechanism 201 provides low-cost, kinematically-constrained alignment with sub-millimeter precision.

Figure 3:
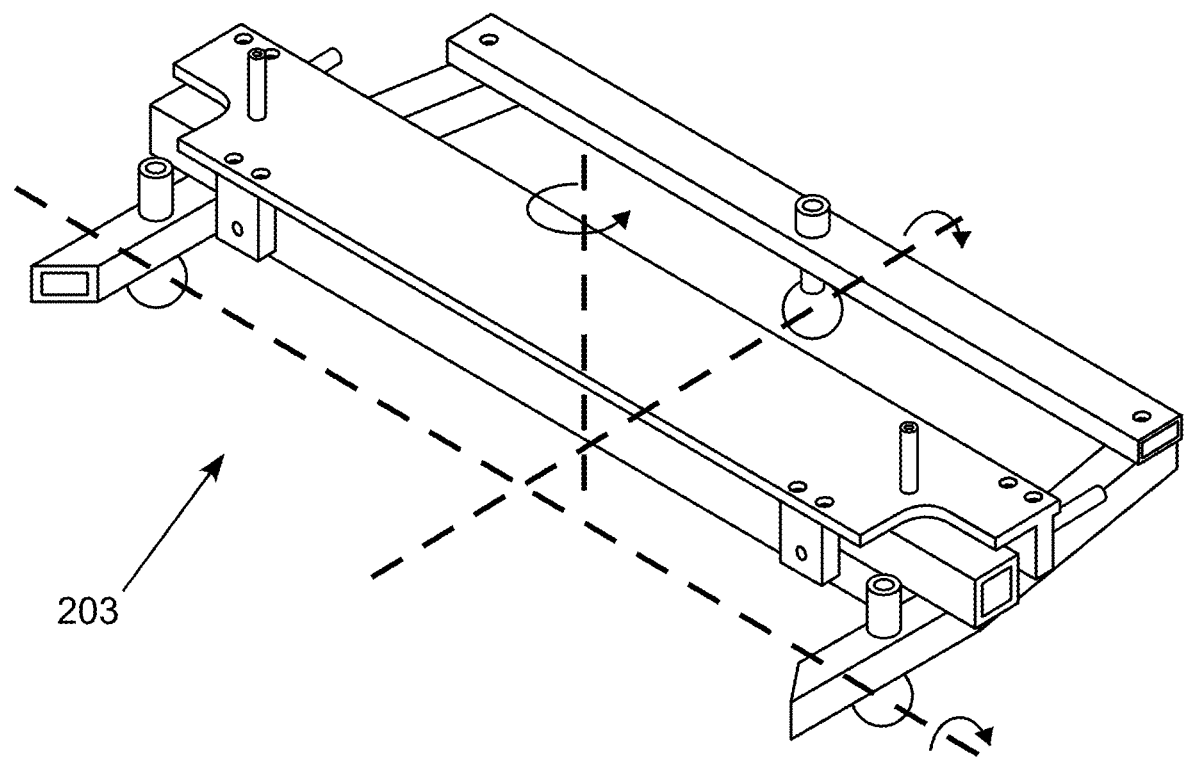
FIG. 3 depicts an alignment fixture.

To further control alignment during cutting, the substrate can be mounted to an alignment fixture 203, which is capable of being placed into a laser cutter (for example, a 30 Watt VLS3.50 $CO_2$ laser cutter; Universal Laser Systems). As shown in FIG. 3, the fixture 203 has 6 degrees of freedom (DOF) to provide corrections in orientation for uniform cutting conditions across a substrate and repeatable alignment within the laser in XYZ for subsequent substrates 202.

In some embodiments, the fabrication process utilizes a design step (step 100) to enable the multi-layer electronic device 300 to conform to complex 3D (non-developable) surfaces. The design step 100 leverages origami-based flattening algorithms to enable 2D sheets to conform to complex 3D surfaces without requiring deformation, buckling, or wrinkling. In one example embodiment, the design step 100 utilizes a software tool implemented in Rhinoceros 3D with Grasshopper and Human UI plugins. The software tool can be used to generate digital processing files for laser cutting and fabrication.

Figure 9:
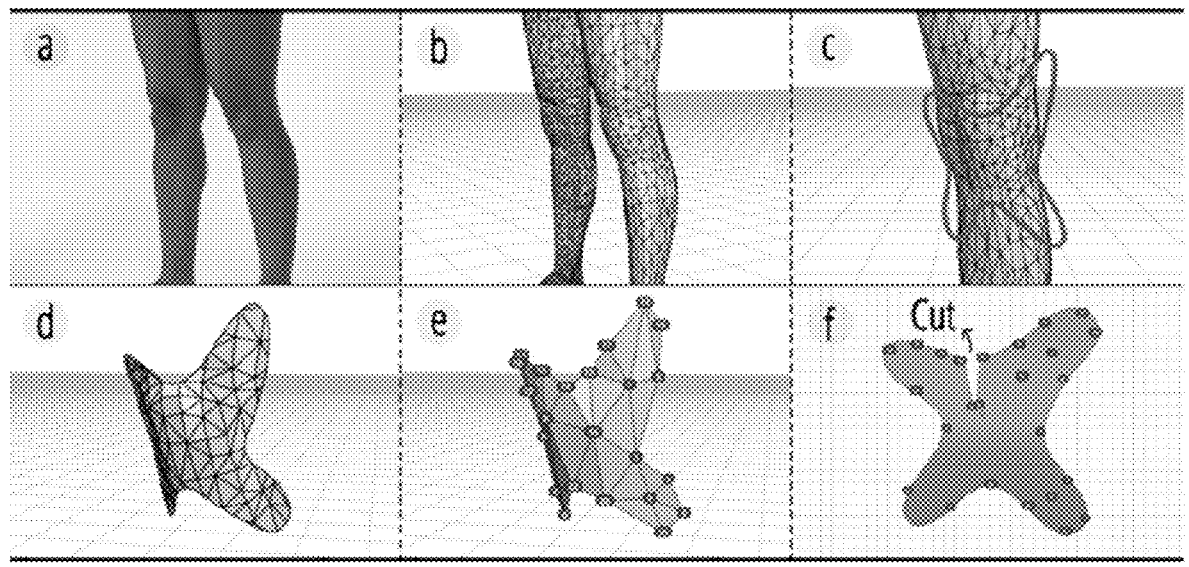
FIG. 9 is a diagram depicting the design process.

The design step 100 of the fabrication process can be divided into three substeps, including: (1) defining a target region; (2) flattening; and (3) circuit customization. Defining a target region allows a user to identify a portion of a user's body where the electronic device 300 will be located. FIG. 9 depicts the process of defining the target region. As shown in FIG. 9, a scanning tool is used to 3D scan the target body location, which generates a 3D model. For example, a mobile application (e.g. Trnio iPhone 3D scanner application) can be used to scan and render a model. Next, the user defines the target region on the 3D model by tracing the region in the model. In one embodiment, the outline is traced in a 2D plane instead of the 3D model for simplicity. After defining the region, the design tool projects the 2D contour onto the 3D model of the user and creates an editable 3D surface. For example, as shown in FIG. 9, a reduced mesh is generated.

For flattening, the design step 100 utilizes the lamination of flat materials to create the complex 3D shapes. Flattening uses origami-based flattening algorithms to approximate an origami model of the 3D surface. The design step 100 parametrically cuts and flattens the selected region of the model to provide minimal distortion when flattened (see, FIG. 9). Reference points are added to assist the user and map the 2D surface back to the original 3D shape, if desired.

Figure 10:
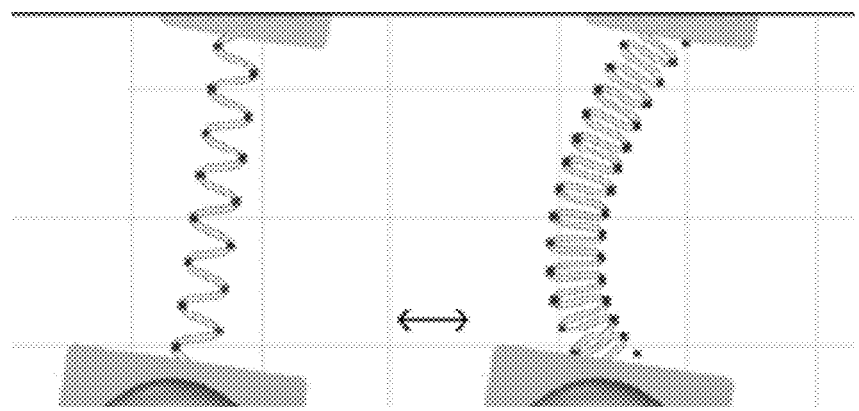
FIG. 10 shows flexible interconnects.
Figure 11:
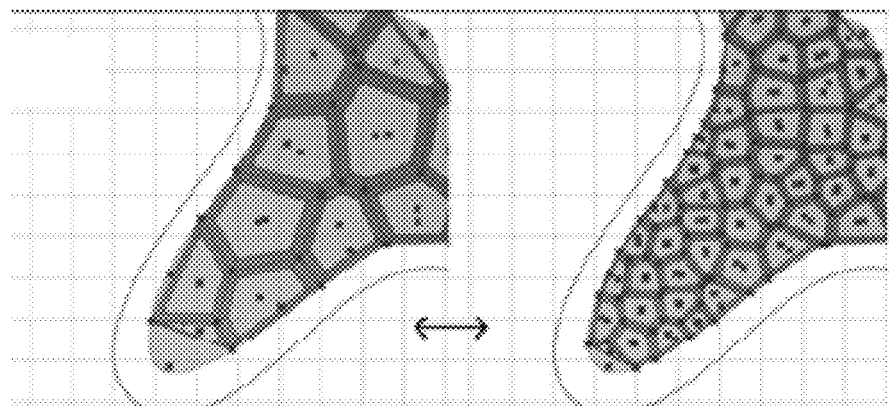
FIG. 11 shows one step of the design process.

As the final part of the design step 100, the electronic circuit of the device 300 is customized. The design tool allows a user to select and place the electronic components, which are stored in a database, on the flattened 2D surface. A baseline curve is then prescribed between each of the circuit components for electrical wiring. To enable the copper circuit to be stretchable, the design tool generates a wavy, serpentine architecture based on the baseline curve specified by the designer (see FIG. 10). Users can adjust the location, path, pitch, width, and geometry of the traces as long as the two end points are connected to the electrical components and no two traces intersect or overlap (see FIG. 10). In one embodiment, the user can also select a region where they would like to generate lace patterns (with holes), or voroni holes. Based on the selected region, the pattern is generated and allows the skin adhesive layer to penetrate through the layers of the device 300 and increase the adhesion to the skin. Visual effects of the lace geometry can be adjusted by the designer (FIG. 11).

Figure 12:
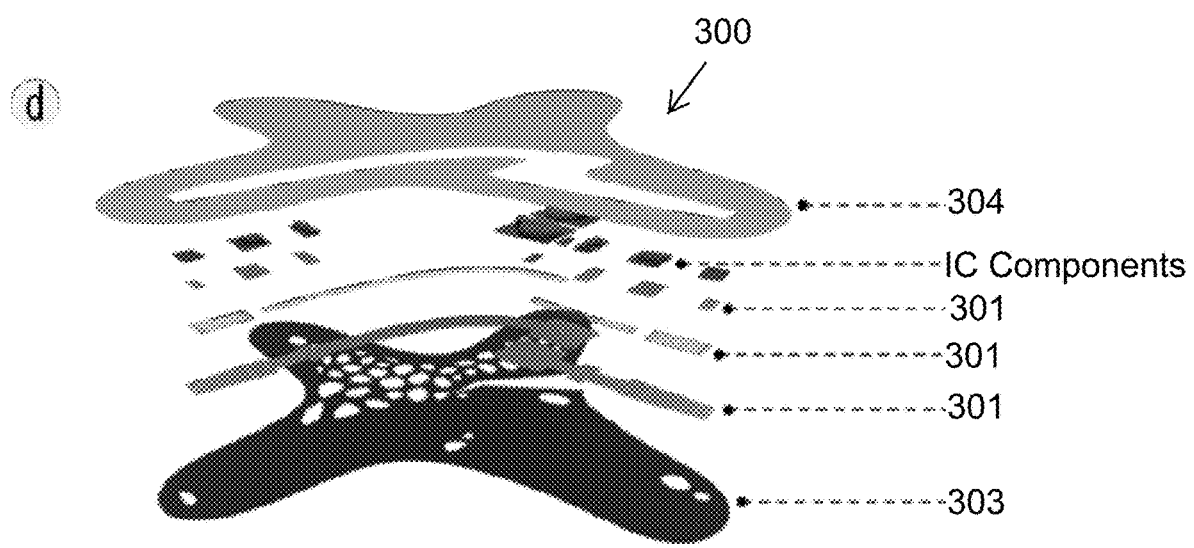
FIG. 12 shows the various components and layers of an electronic device, according to one example embodiment.

Once the design step 100 is completed, digital fabrication files are generated for each of the individual layers within the electronic device 300 (see FIG. 12). The fabrication process can then proceed as described above beginning with step 101. As noted, the multi-layer fabrication approach utilizes commercially available materials that do not require surface modifications, chemical treatments, or curing. The layers used within the fabrication process provide robust lamination through inherent adhesion. Furthermore, the selected materials are readily available in roll format and can be easily processed and scaled using conventional roll-to-roll manufacturing methods for mass production.

Figure 13:
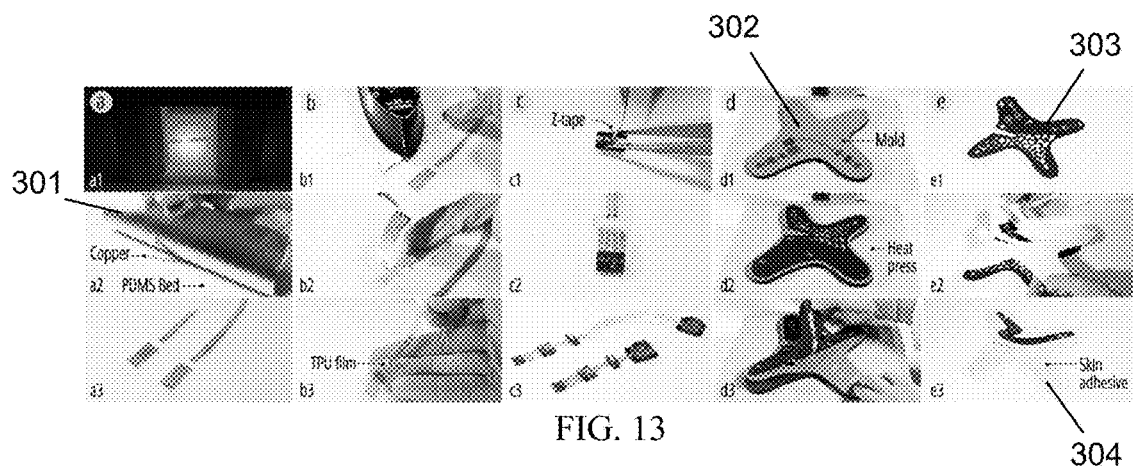
FIG. 13 shows various steps of the fabrication process.

FIG. 13 depicts the fabrication process where multiple layers of flat materials 301 are first processed by laser cutting and then laminated together using the inherent adhesion of pressure- or heat-sensitive adhesive films. First, a flexible copper clad composite material 301 (FR7031, DuPont) is laminated onto a PDMS bed (10:1 Sylgard 184, Dow Corning), or substrate 202, and processed using UV laser micromachining (Protolaser U3, LPKF). The film is cleaned and the excess copper film is removed, revealing copper traces that will be used to interconnect the various components of the device 300.

Next, as shown in FIG. 13, a thin, compliant thermoplastic polyurethane (TPU) heat-sensitive film (3412, Bemis) is laminated onto the copper traces using a hand-iron or heat press (120° C., 30 secs). The film adhesively bonds to the copper traces and the stack is removed from the PDMS bed 202.

A pressure-sensitive tape that is conductive through its thickness (for example, ECATT 9703, 3M) is bonded to the IC modules (see FIG. 13). The IC modules are electrically connected and adhesively bonded to the stretchable copper interconnects to form a base 302. Next, the electrical circuits forming the base 302 are placed within a foam mold and bonded to a spandex blend fabric substrate 303 using the TPU heat-sensitive film.

Figure 14:
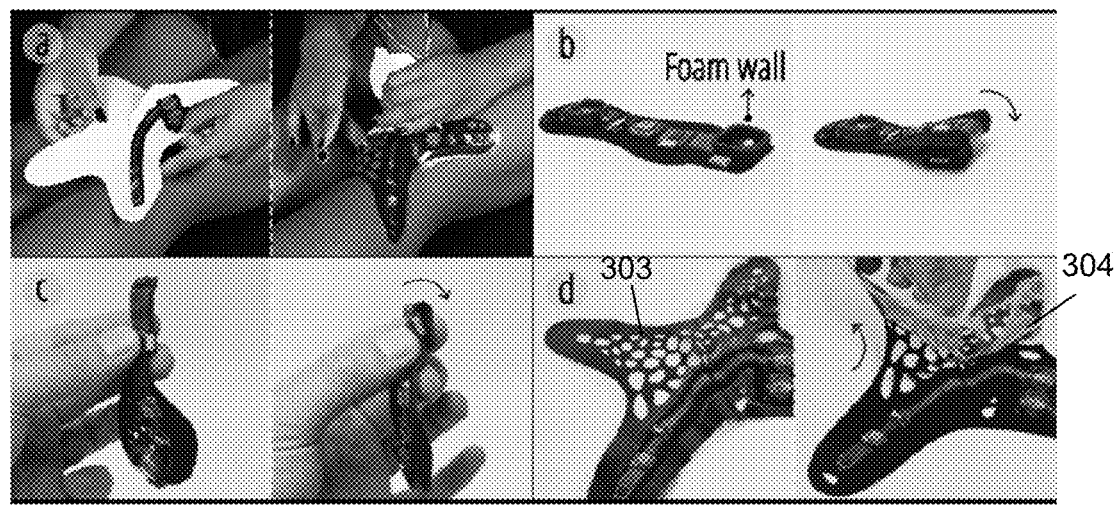
FIG. 14 shows the device with a removable substrate.

Finally, a transparent, medical grade adhesive film 304 (Tegaderm, 3M) is bonded to the outer layer of the multilayer device 300 to provide a method for attaching to the body of a user (FIG. 13). The device 300, or electronic bandage in some embodiments, is attached to the body by applying light pressure and peeling of the backing layer. The medical grade adhesive 304 can be easily removed from the electronic bandage device 300 and replaced, allowing the device to be reused (FIG. 14). By assembling the electronic circuit on a reusable stretchable substrate 303, the adhesive layer can be removed and replaced to allow the device 300 to be used multiple times, unlike devices where the electronic components are assembled directly onto the adhesive layer. The inclusion of a reusable substrate 303 can be accomplished with the comprehensive holistic fabrication steps disclosed herein. Further, while the substrate 3030 is described as spandex in one example embodiment, a person having skill in the art will appreciate that other stretchable fabrics and materials can be used.

As shown in the drawings, the electronic device 300 comprises a network of high performance integrated circuits. The circuits are wired together using a digital, 2-wire communication bus. To simplify the design and fabrication process in one example embodiment, individual printed circuit board (PCB) modules are created for each integrated circuit (IC) within the network. The modules also include all of the required supporting electronics (e.g. capacitor, resistor). A Cortex-M4F processor with Bluetooth low energy (BLE) radio (nRF52, Nordic) is the central core of the device and is responsible for signal processing, wireless communication, and control of the interactive components. To demonstrate the versatility of the device, a variety of on-body sensors are selected that face the skin to noninvasively monitor biosignals (e.g. heart rate) or face outwards to monitor and/or interact with the environment (e.g. camera, LED). Examples of sensors that can be used include a pulse oximeter (MAX30101, Maxim), high-fidelity accelerometer (MPU6650, Inven-Sense), 9-DOF position sensor (BN0055, Bosch), single pixel camera (TCS34725, AMS), MEMS microphone (SPH0645LM4H-B, Knowles), and temperature sensor (MCP9808, Microchip). However, many other types of sensors can be used in addition to the examples listed. To provide information or interact with the environment, an RGB LED module that includes a microcontroller (ATIVIega328, Microchip) can be provided. Finally, ancillary power management modules (e.g. battery and power regulation) are shared between all of the components on the electronic device.

As previously described, the network of IC modules are electrically wired together with stretchable electrical wiring. In one embodiment, the wiring comprises a highly conductive, 70 pm thick flexible copper-clad (FR7031, DuPont) composite material. To enable stretchability, the flexible copper-clad material is laminated onto a silicone bed (Sylgard 184, Dow Corning) and patterned into a wavy, serpentine shape using a UV laser micromachining system (Protolaser U3, LPKF). The excess film is then removed and the remaining copper trace is bonded to a compliant thermoplastic polyurethane (TPU) film (3412, Bemis) using a heat press (120° C., 30 secs). The stretchable interconnects are then electrically connected and adhesively bonded to the IC modules using an anisotropic, through thickness conductive tape (ECATT 9703, 3M).

In one embodiment, the electronic circuit is laminated onto a spandex blend fabric substrate 303 (120° C., 60 secs) to provide increased robustness and durability, while allowing the electronic device to be reused. This is in stark contrast to previous efforts, which are assembled on thin adhesive films or temporary tattoo paper. Use of these thin films or temporary substrates requires disposal after use due to the electronic circuit being damaged during removal or lack of reusable medical grade skin adhesives. Furthermore, because of the ultra-thin film, these devices are often difficult to adhere to the body without self-adhesion (or clinging) as electrostatic forces become dominant.

Wearable electronics that directly adhere to the skin result in improved signal quality due to reduced motion artifacts and provide access to locations on the human body without unnecessarily diminishing the somatosensory system. For example, a sensor can be placed on the back of the hand or palm without requiring a glove that would diminish the users sense of touch. As such, the device 300 uses a transparent, medical grade adhesive film that is breathable, waterproof, and provides a sterile barrier (for example, Tegaderm, 3M). Holes are laser cut in the location of the IC modules and the adhesive is then directly bonded to the fabric substrate 303. The adhesive film provides robust adhesion to the user and enables temporarily attachment for hours to days.

Figure 15:
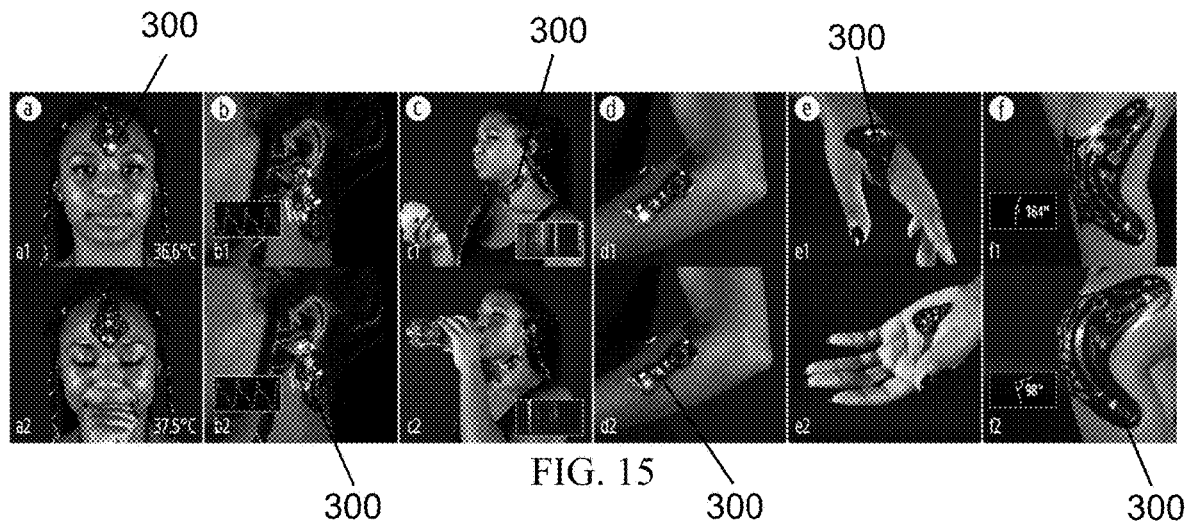
FIG. 15 provides example applications of the device.

The fabrication technique allows easy access to locations on the body that were previously difficult to access, time consuming to design, or even not possible using existing methods. FIG. 15 depicts several different examples of a device 300 (or electronic bandage) created using the fabrication method described herein. Each electronic bandage application shown in FIG. 15 illustrates a different location on the body of varying geometric complexity and functionality (e.g. health, entertainment, decorative/beauty). For example, FIG. 15 shows: (i) a forehead mask with temperature sensor and RGB LED to provide a simple, non-invasive, and real-time assessment of body temperature (e.g., green: nominal, red: elevated body temperature); (ii) an earring that noninvasively monitors pulse rate and blood oxygen saturation; (iii) a food detecting necklace capable of classifying a variety of foods including potato chips, nuts, fruit, and liquids by monitoring high-fidelity acceleration and sound at the neck; (iv) a smart wound healing bandage with a single pixel camera that faces toward the skin to monitor the wound healing process and an RGB LED to provide a visual indication of the healing process by fading from red, to yellow, to green; and (v) a motion tracking device that contains two independent electronic circuits to monitor orientation and motion of the proximal and distal shank of the leg (this example highlights the ability of the stretchable electronic bandage to intimately interact with the user without limiting the kinematics or dynamic motion of the human body).

Figure 16:
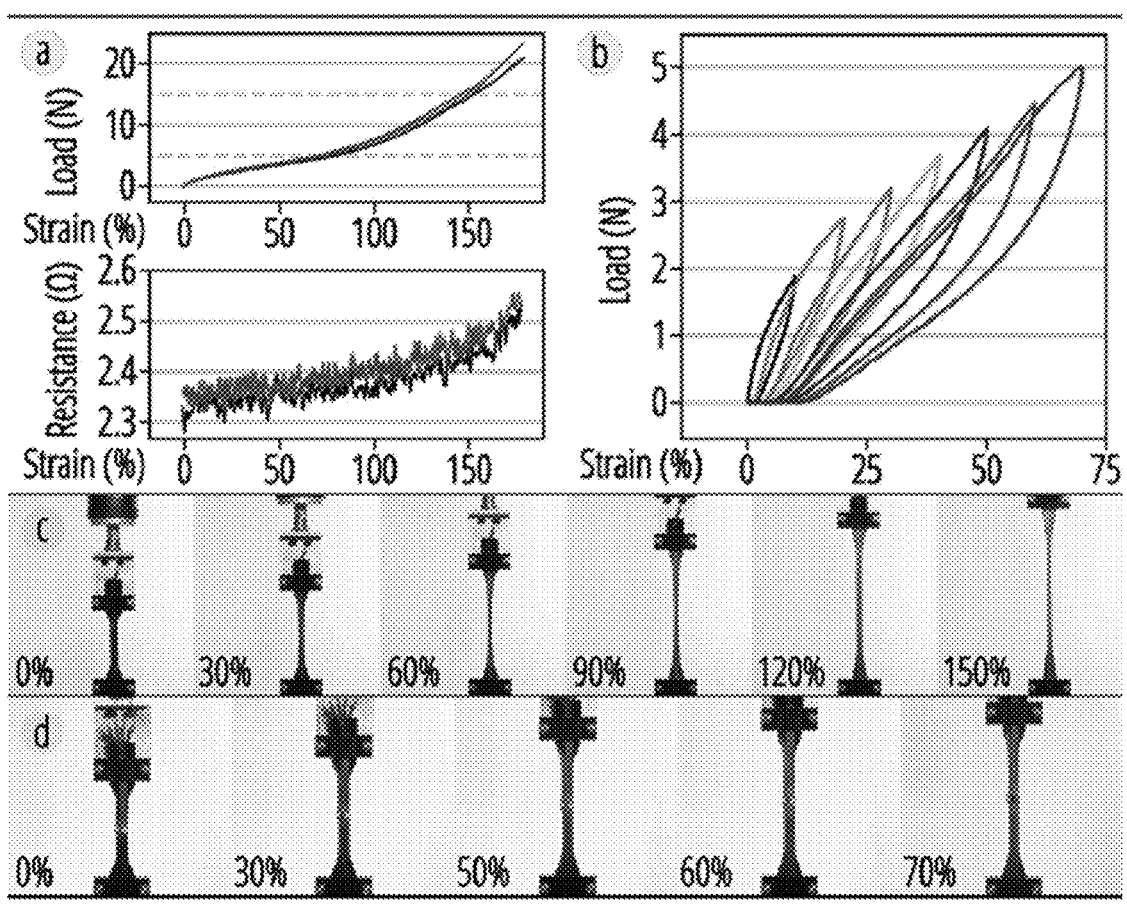
FIG. 16 is a series of graphs depicting mechanical properties of the device.

As the stretchability of this device 300 provides an improvement over more rigid devices, the performance of the device 300 can be evaluated through tensile loading. The stretchable electrical wiring is first examined by stretching a single electrical interconnect, which is laminated onto fabric substrate 303 using TPU film until failure occurred (electrical or mechanical). The electrical wiring is loaded at a rate of 100 mm min−1 and is observed to be soft, highly deformable (maximum elongation: 164.8+10.9%) and exhibit a minimal absolute change in electrical resistance as a function of applied strain (<10% at 170% strain; FIG. 16). A photograph sequence of increasing strain is shown in FIG. 16, where electrical failure occurs shortly after at a strain of 171%. Cyclic testing is then completed for a simplified circuit with a single LED located at the center of a dogbone sample. The device 300 is strained for two cycles at increasing levels of strain from 10%, 20%, 30%, 40%, 50%, 60%, and 70% strain (FIG. 16). A photograph sequence of increasing strain and a magnified image of the electrical trace is shown in FIG. 16. The rigid component introduces a stress concentration and results in premature failure of the device shortly before reaching a strain of 70%.

In another example embodiment of the fabrication technique without using the optional design step 100, the process of fabricating a strain sensor begins at step 101 using a 30 Watt $CO_2$ laser system outfitted with an alignment fixture 203 (see FIG. 3) supporting PDMS (Dow Corning Sylgard 184) substrates 202 for laser machining. The PDMS substrates 202 are mixed at oligomer to curing agent ratios of 5:1, 10:1, 20:1, and 30:1 and are cured at room temperature on a flat, level surface for 48 hours and then post cured in an oven at 70 C for four hours. The materials 301 used for the sensor 300, comprising conducting and insulating tapes, are laminated onto the PDMS substrates 202 and then laser cut with a predefined pattern. After laser cutting, at step 102 excess material is stripped off and any release liners are removed by cleaning the surface with isopropyl alcohol and then adhesive tape is used to remove all release liners simultaneously. Alternative processes may be used to release the liners. Layers are then assembled on alignment pegs which interface with a hole and slot in each of the substrates 202. A first layer contains an insulating material and conductive material laminated to a 5:1 mixing ratio substrate 202. A second layers contains an insulating layer laminated to a 5:1 mixing ratio substrate 202. A third layer contains an conductive material and insulating material laminated to a 30:1 mixing ratio substrate 202. At step 103, pressure is applied with a roller to ensure adhesive contact between layers and then the upper substrate 202 is peeled off to transfer the patterned elements, creating a five layer electronic device 300. The sensors 300 in this example were 18+/−1 mm long, 6.5 mm wide, and 1.8 mm thick.

Figure 4:
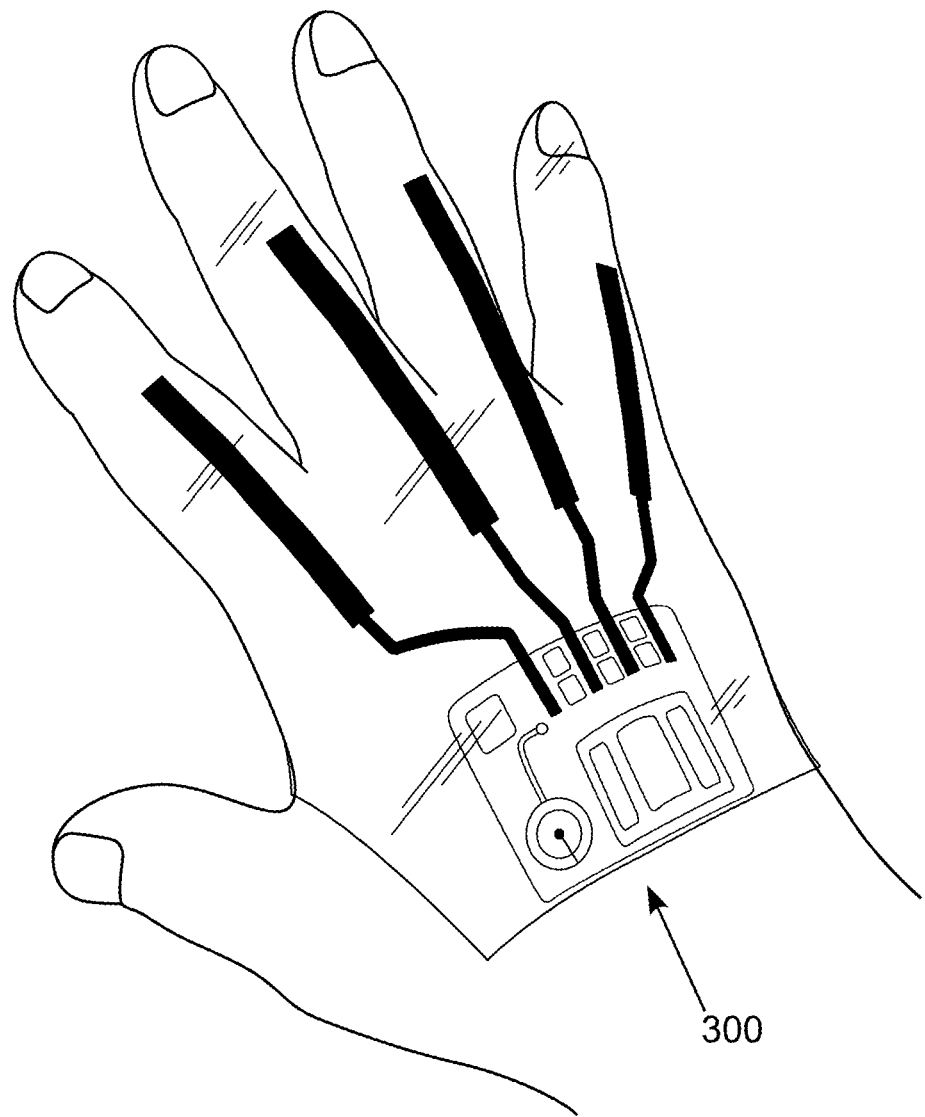
FIG. 4 shows an integrated multilayer device fabricated by the method of the present invention.

In another example embodiment, integrated skin sensors 300 are fabricated using the method of the present invention. Body mounted electronics that are designed to naturally interface with the human skin can provide inherent advantages and superior sensitivity for health monitoring compared to devices made from rigid materials. The device 300 comprises a customizable integrated sensor that adheres to the hand and monitors hand gestures, as shown in FIG. 4. The device 300 contains four capacitive strain sensors that extend over the metacarpophalangeal and proximal interphalangeal joints of each finger. Stretchable circuit interconnects are used to connect the sensor elements to a flexible printed circuit (FPC) board that contains a Bluetooth transceiver and is powered with a coin cell battery. The interconnects are composed of laser-patterned eCAP 7805 conductive tape, which bonds to the terminals of the FPC. The fabrication of the soft integrated skin sensor follows the methodology above with the added capability of transferring the FPC interface board onto the integrated sensor during the processing to ensure proper alignment. The integrated skin sensor adheres to the hand using a medical grade, highly breathable adhesive dressing (Tegaderm, 3M). The wearable system is lightweight (less than 5 grams) and thin enough to fit under an examination glove.

Figure 5A:
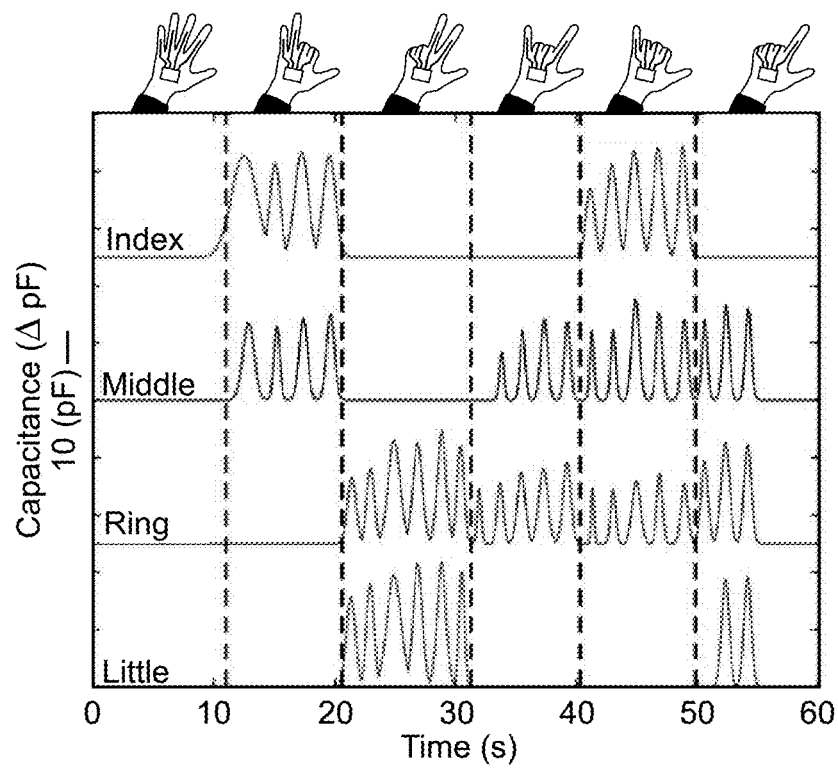
FIGS. 5A-5B are graphs depicting the signals generated by an integrated skin sensor fabricated by the method of the present invention.
Figure 5B:
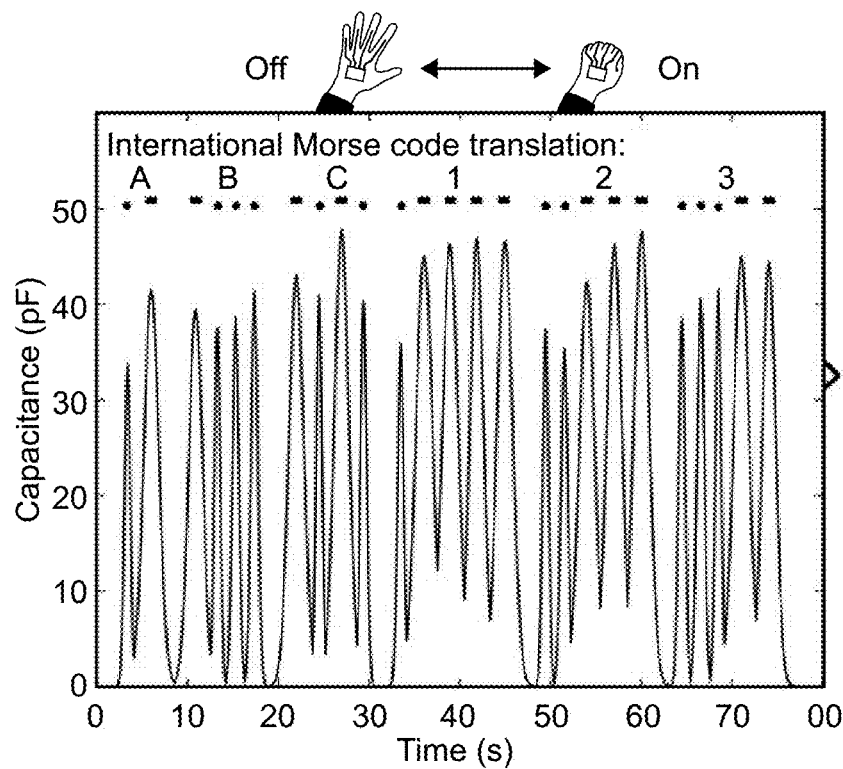

The functionality of the integrated skin is shown by a series of hand gestures. As seen in FIG. 5A, a variety of gestures are recognized by the integrated skin sensor 300. In these experiments, the hand cycles through different multi-finger gestures, where capacitance of the individual strain sensors is measured. Further, alpha-numeric data communication is also possible through the integrated sensing skin, where Morse code can be generated by opening and closing the hand at different frequencies to generate the three communication states: dot, dash, and silence. This is demonstrated in FIG. 5B, where A- B- C- 1- 2- 3 is transmitted and is interpreted through software to automatically identify the pattern of dots and dashes.

Figure 6A:
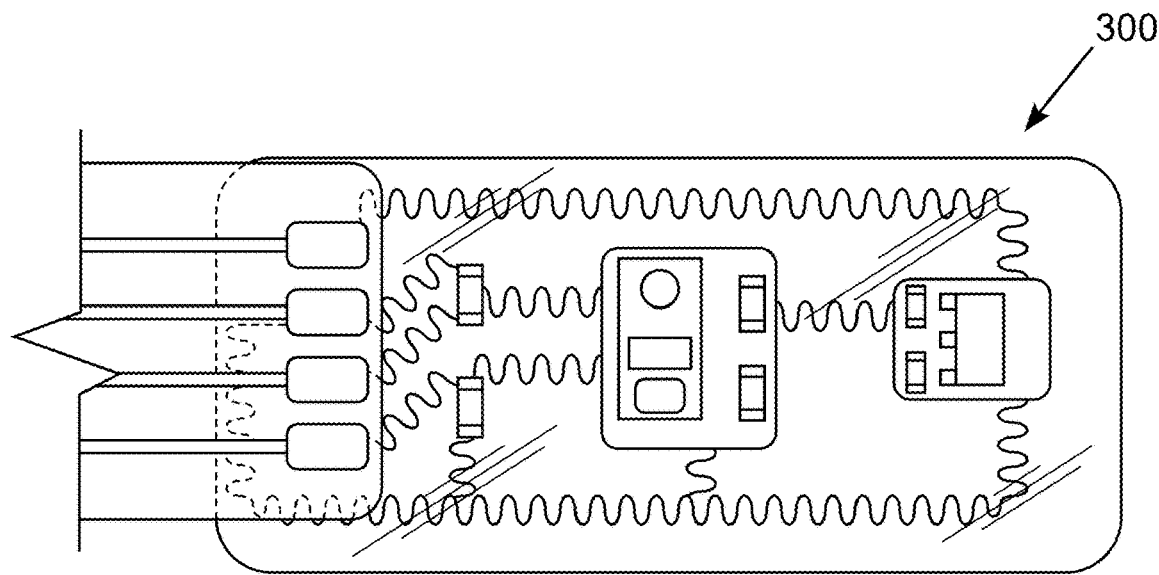
FIGS. 6A-6C depict a multilayer device fabricated by an alternative embodiment of the method of the present invention.
Figure 6B:
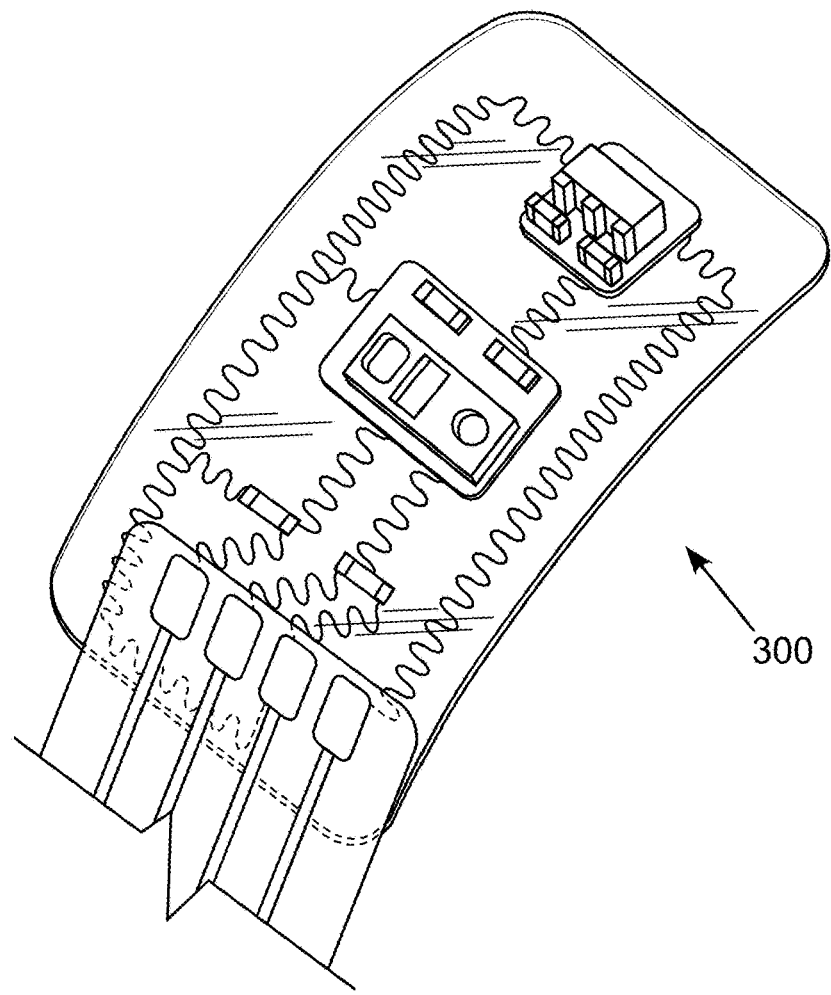
Figure 6C:
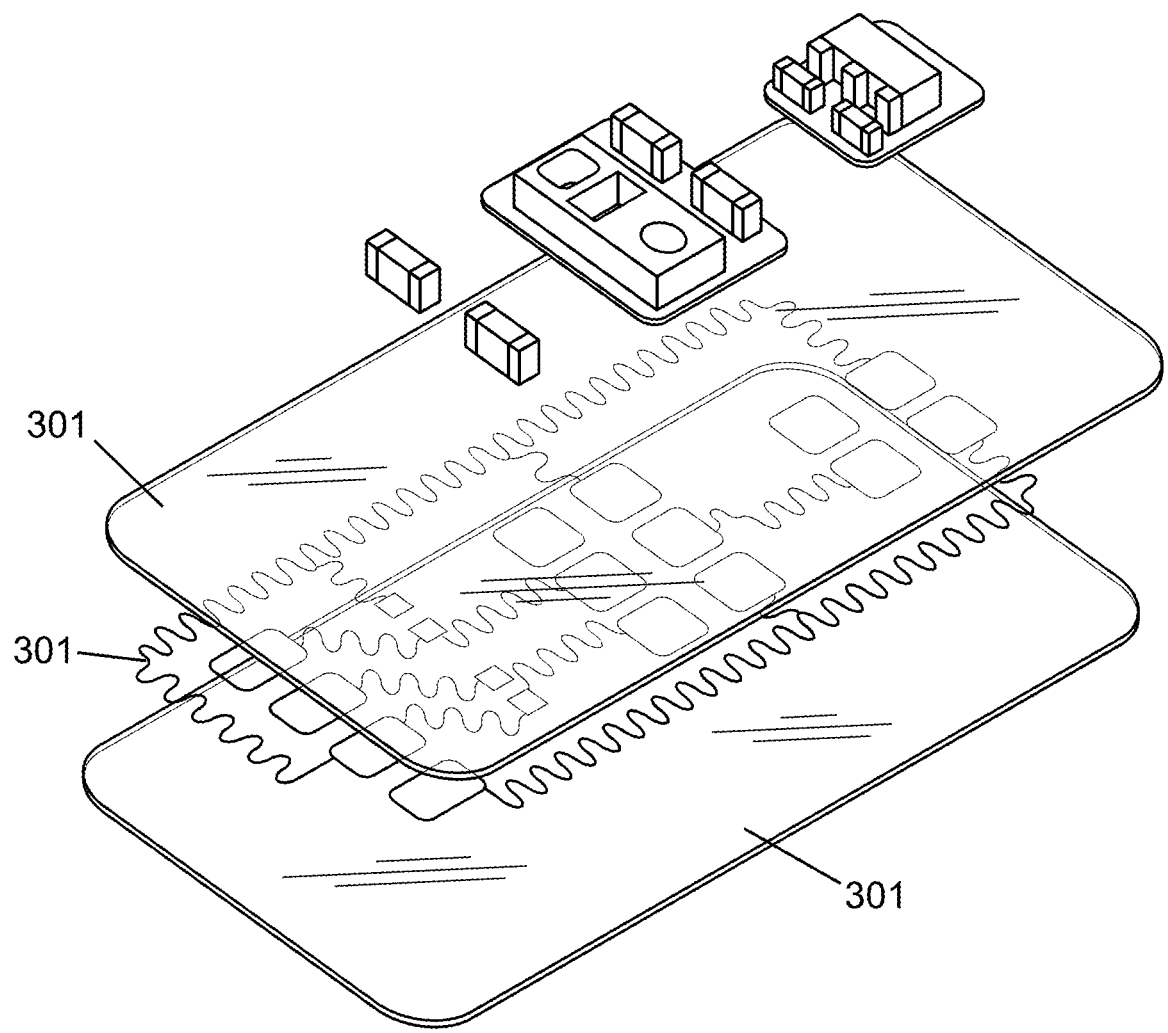

In yet another example embodiment, skin mountable pulse oximeter devices 300 are fabricated. To extend this fabrication methodology to a wider variety of materials, in this embodiment a UV laser micromachining system (ProtoLaser U3; LPKF) is used in step 101. A UV laser system is capable of patterning metals in addition to polymeric materials. Instead of an alignment fixture 203, the laser micromachining system is equipped with a fiducial recognition camera. Material assembly follows the same principals as the $CO_2$ laser fabrication, where an alignment mechanism 201 (i.e. pegs) control layer alignment and deterministic adhesion transfer printing assembles each layer into a multilayer construction. This process takes advantage of the additional material capabilities by laser patterning serpentine architectures of stretchable interconnects out of 70 μm thick flexible copper-clad laminated composite (FR7031 DuPont) to create a wearable pulse oximeter (FIG. 6A). This soft device is capable of bending and stretching (FIG. 6B) and consists of a combination of soft materials and rigid components (FIG. 6C) which are all sequentially assembled through the laser patterning and adhesion assembly process.

During assembly of the rigid components the PDMS substrate 202 thickness was chosen so that the lateral dimension of the rigid component was no more than twice the substrate thickness to avoid adhesion effects from substrate confinement. The multilayer composite consists of a medical grade adhesive for bonding to the skin, laser patterned flexible copper-clad interconnects, a thru thickness conductive adhesive layer (ECATT 9703; 3M) which serves to electrically and adhesive connect the interconnects to the active and passive electrical components and prevent shorting within the plane in the pulse oximeter circuit. The parallel processing capabilities of the assembly process allows simultaneous assembly of four, fully functional wearable pulse oximeter devices. The ability to assemble planar as well as three dimensional components of both soft and rigid elements in a parallel manner provides versatility to create a variety of functional wearable devices.

Figure 7:
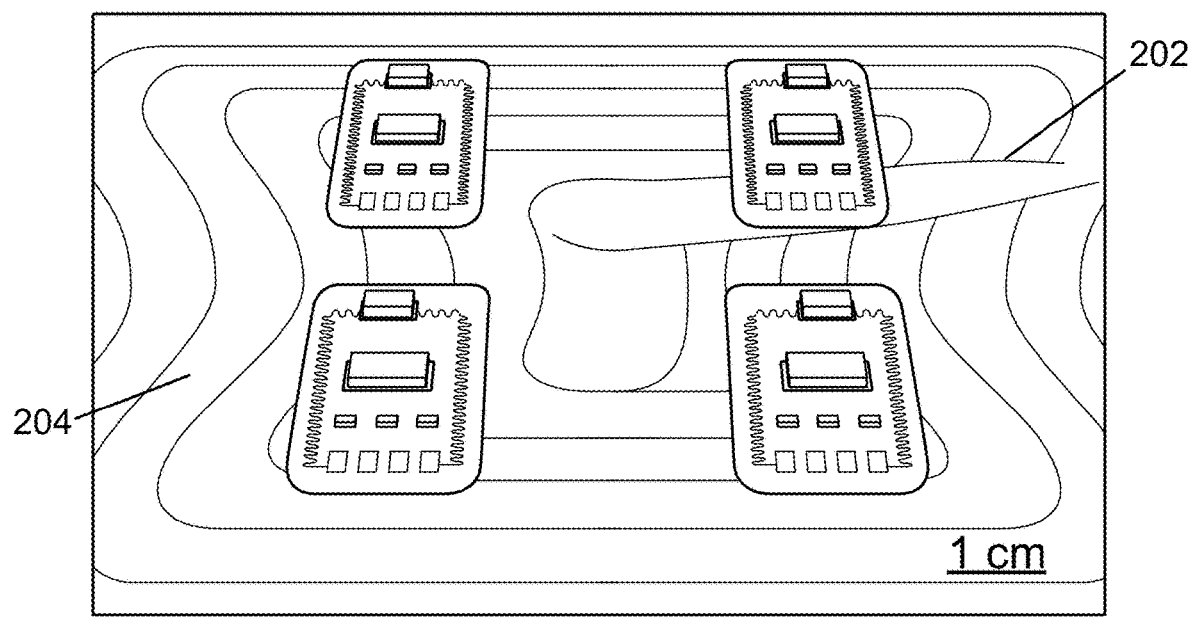
FIG. 7 shows multiple multilayer devices on a substrate.

In this example embodiment, a LPKF ProtoLaser U3 UV laser micromachining system was used with camera based fiducial recognition to automatically and reliably locate the position of PDMS substrates 202 that have fiducials 204 machined into the substrate (see FIG. 7). The fiducials 204 are precisely placed relative to the hole and slot that is used for alignment during the adhesive transfer process. PDMS is mixed at oligomer to curing agent ratios of 5:1, 10:1, and 20:1 and are cured at room temperature on a flat, level surface for 48 hours and then post cured in an oven at 70 C for four hours. Interconnect material is laminated onto the PDMS substrates 202, the fiducials are automatically located, and the material is laser cut with a predefined pattern. After laser cutting, excess material is stripped off and any release liners are removed. Individual stencils were patterned out of release liner for the transfer of the rigid electrical components. Layers are then assembled on alignment pegs which interfaces with a hole and slot in the substrate 202. A first layer includes a component stencil and a stacked release liner on a 5:1 mixing ratio substrate 202. A second layer consists of a Z-film on a 10:1 mixing ratio substrate 202. A third layer includes the copper-clad laminated composite on a 10:1 mixing ratio substrate 202. A fourth layer includes a transparent film adapted for contact with human skin (Tegaderm) on a 20:1 mixing ratio substrate 202. Pressure is applied to the top substrate 202 to ensure adhesive contact between layers and then the upper substrate 202 is peeled off to transfer the patterned elements.

When several layers are used, the assembly of both rigid and soft components through an adhesion-based, transfer printing process is challenging due to the varying material stiffness, viscoelastic response, and interfacial properties. Previous work with transfer printing soft elastomer layers includes decal transfer lithography, which involves chemical bonding treatments and multiple steps to transfer a single layer. Kinetic controlled transfer printing can be used without chemical treatments but relies on rate dependent adhesion, which can be challenging with multiple rate dependent components in the system. To overcome these challenges, the material assembly in the present invention at step 103 is accomplished by controlling the substrate 202 adhesion energy by modifying their viscoelastic response through mixing ratio and by using laser cutting to tune adhesion response. By altering the mixing ratio of the PDMS material, for example, the modulus of elasticity of the cured substrate 202 can be controlled. This enables deterministic material construction in multi-dimensional layouts.

Figure 8A:
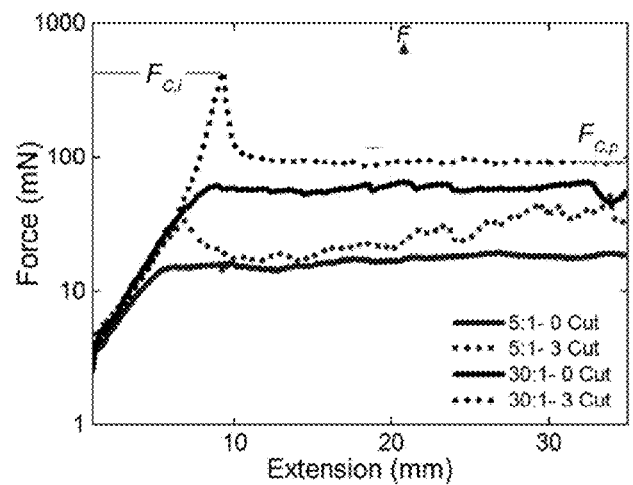
FIGS. 8A-8C are graphs showing the peeling force.

To characterize the adhesion transfer process of step 103, 90° peel experiments can be conducted. The samples are prepared in the same manner as the transfer process and after removing excess sensor material, an inextensible film is adhered to the sensor and then loaded into a peel setup. Representative peel adhesion curves for 5:1 and 30:1 substrates are presented in FIG. 8, where the force increases until crack initiation, $F_{c,i}$, and then drops as the crack begins to propagate at a constant force, $F_{c,p}$. Both the substrate 202 choice and laser cutting conditions control the adhesion behavior. It should be noted that the y-axis in FIG. 8 is plotted on a log scale to capture the significant differences in adhesion force for the different conditions. Specifically, after three laser cuts the 30:1 substrate has an initiation force which is over 10× higher than the 5:1 substrate. This difference enables the samples to be controllably transferred from the 5:1 substrate to the 30:1 substrate, since the sample will separate from the 5:1 substrate before the other sample will separate from the 30:1 substrate.

Figure 8B:
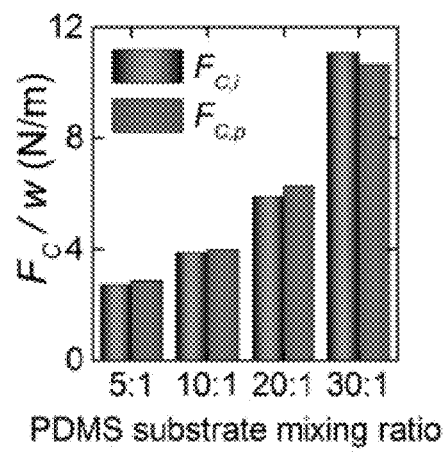
Figure 8C:
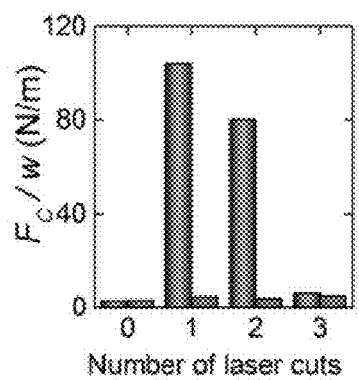

Adhesion control can be investigated further by varying the substrate mixing ratio from 5:1 to 30:1 and varying the laser cutting from 0 to 4 passes on the same location on the substrate 202. For the case where sensors are laminated onto the substrates with no laser cutting, there is an increase in peel adhesion force as the mixing ratio of the substrates increases (FIG. 8B). This can be attributed to the increasing viscoelastic response of the materials as the mixing ratio increases due to greater dissipation near the crack tip. As a result, laser cutting can also act as a control parameter in this transfer process. For example, as seen in FIG. 8C, the peel initiation force increases by nearly 40× when a sensor is laser cut on the 5:1 substrate compared to just laminating the sensor onto the substrate. As subsequent cuts are made this initiation force decreases and on the third pass the force nearly returns to the laminated value.

As the sensor layers become impinged into the PDMS substrate 202 upon laser cutting, a greater force is required to separate the materials at the contact edge. This effect is reduced upon subsequent cutting as the already formed cut line in the PDMS substrate 202 reduces the interaction between the sensor layers and the substrate 202. This result allows the substrates 202 to be used over many fabrication cycles, because the laser cutting effects diminish upon subsequent cutting and the substrate adhesion energy then dominates the transfer process at step 103. The stamp 202 can also be preconditioned by running the laser cutter over the stamp at a reduced power and speed before the material is laminated to the stamp to diminish the impinging effect of laser cutting.

The rapid assembly process for soft multilayered electronics presented here is efficient, highly customizable, and employs materials and equipment that are readily accessible. This method was demonstrated on two different laser micromachining systems at the sub-mm to cm scale. More than ten different materials (IC components, discrete circuit elements, soft insulators, and conductive soft adhesive films) are transferred using a deterministic adhesive-transfer approach. This versatility in fabrication and materials selection allows for varying shapes (2D/3D), sizes (0.01 to 100 $cm^2$), and materials properties (Young's modulus from ~100 kPa to 100 GPa). Adhesion-controlled transfer was influenced by the choice of substrate (peel initiation force increases greater than 10×) and laser cutting conditions (peel initiation force increases by nearly 40×).

What is claimed is:

1. A method of fabricating a stretchable wearable electronic device comprising:
    patterning a material affixed to a first substrate with a laser cutter to create a first layer;
    creating at least one additional layer on a second substrate;
    joining the first layer and the at least one additional layer through contact adhesion,
        wherein the contact adhesion is greater than a force of adhesion between at least one of the first layer and the first substrate and the at least one additional layer and the second substrate;
    releasing at least one of the first layer from the first substrate and the at least one additional layer from the second substrate;
    integrating an IC component with the first layer and at least one additional layer to form a base; and
    affixing the base to a stretchable substrate through a contact adhesion between the base and the stretchable substrate.

2. The method of claim 1, wherein the stretchable substrate is reusable.

3. The method of claim 1, wherein the stretchable substrate comprises a fabric.

4. The method of claim 1, wherein at least one of the first substrate and the second substrate comprises polydimethylsiloxane.

5. The method of claim 4, further comprising:
    adjusting a modulus of elasticity of at least one of the first substrate and the second substrate to affect adhesion.

6. The method of claim 1, further comprising:
    patterning at least one of the first substrate and the second substrate to affect adhesion.

7. The method of claim 1, wherein the material is an acrylic tape.

8. The method of claim 1, wherein joining the first layer and the at least one additional layer comprises:
    aligning the first substrate of the first layer and the second substrate of the at least one additional layer with a locating mechanism.

9. The method of claim 8, wherein the locating mechanism comprises a slot on each of the first substrate and the second substrate and a pin.

10. The method of claim 1, wherein the first layer comprises a heat-sensitive film.

11. A method of fabricating a stretchable wearable electronic device comprising:
    identifying a target region on a three-dimensional scan of a user's body for placement of the wearable electronic device;
    developing an origami model of a surface in the target region;
    using the origami model to construct a pattern;
    based on the pattern, cutting a material affixed to a first substrate with a laser cutter to create a first layer;
    creating at least one additional layer on a second substrate;
    joining the first layer and the at least one additional layer through contact adhesion,
    integrating an IC component with the first layer and the at least one additional layer to form a base; and
    affixing the base to a stretchable substrate through a contact adhesion between the base and the stretchable substrate.

12. The method of claim 11, wherein the contact adhesion between the first layer and the at least one additional layer is greater than a force of adhesion between at least one of the first layer and the first substrate and the at least one additional layer and the second substrate.

13. The method of claim 11, wherein the stretchable substrate is reusable.

* * * * *